Figure 1:
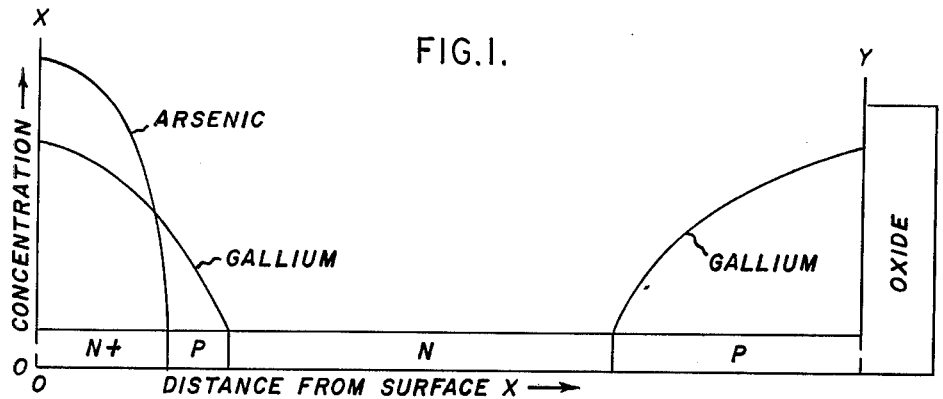

United States Patent [19]

Marcotte

[11] 3,943,016
[45] Mar. 9, 1976

[54] GALLIUM-PHOSPHORUS SIMULTANEOUS DIFFUSION PROCESS

[75] Inventor: Raymond L. Marcotte, Auburn, N.Y.

[73] Assignee: General Electric Company, Syracuse, N.Y.

[22] Filed: Feb. 5, 1973

[21] Appl. No.: 329,356

Related U.S. Application Data

[63] Continuation of Ser. No. 95,533, Dec. 7, 1970, abandoned.

[52] U.S. Cl.................................. 148/189; 148/187
[51] Int. Cl.².......................................... H01L 7/36
[58] Field of Search ............ 148/186, 189, 187, 175

[56] References Cited
UNITED STATES PATENTS

| | | | |
|---|---|---|---|
| 2,802,760 | 8/1957 | Derick et al. ........................ | 148/189 |
| 2,861,018 | 11/1958 | Fuller et al. ......................... | 148/189 |
| 2,979,429 | 4/1961 | Cornelison et al. ................. | 148/189 |
| 3,183,129 | 5/1965 | Tripp ................................... | 148/186 |
| 3,362,858 | 1/1968 | Knopp ................................. | 148/189 |
| 3,377,216 | 4/1968 | Raithel................................. | 148/189 |
| 3,468,729 | 9/1969 | Bentley et al........................ | 148/187 |
| 3,484,313 | 12/1969 | Tauchi et al......................... | 148/187 |
| 3,615,932 | 10/1971 | Makimoto............................ | 148/175 |

*Primary Examiner*—Walter R. Satterfield
*Attorney, Agent, or Firm*—R. J. Mooney; D. E. Stoner

[57] ABSTRACT

By protecting one surface of a silicon element with an oxide layer while leaving another surface exposed it is possible to diffuse both gallium and phosphorus into the silicon element simultaneously in a selective manner. Gallium will penetrate the oxide layer while phosphorus will not, thereby forming a P conductivity type layer beneath the oxide layer. At the same time both gallium and phosphorus will diffuse into the remaining surfaces of the element. A higher concentration of phosphorus than gallium will diffuse to all depths, thereby forming an N conductivity type layer adjacent the exposed surface of the silicon element.

10 Claims, 3 Drawing Figures

INVENTOR:
RAYMOND L. MARCOTTE,

GALLIUM-PHOSPHORUS SIMULTANEOUS DIFFUSION PROCESS

This is a continuation of application Ser. No. 95,533, filed Dec. 7, 1970, titled "Gallium-Phosphorus Simultaneous Diffusion Process" now abandoned.

My invention relates to a process whereby both P and N conductivity type layers may be formed simultaneously in silicon.

It has been recognized prior to my invention that both P and N conductivity type layers may be formed in silicon semiconductive elements in a single diffusion step. According to one such process a P conductivity type impurity is painted onto one surface of each of a plurality of silicon wafers while an N conductivity type impurity is painted onto the remaining surfaces of the wafers. The wafers are then stacked with adjacent surfaces having like conductivity type source material therebetween. The wafer stack is then heated to a temperature sufficient to drive the impurity material into the wafer surfaces with which it is most intimately asociated. In this way an N conductivity type layer is formed adjacent one major surface of each wafer while a P conductivity type layer is formed adjacent the remaining major surfaces.

While this particular approach has been discussed in a number of patents, it has not received, to the best of my knowledge, more than limited commercial utilization. One problem that has been encountered is that the wafer stack may require extended soaking in hydrofluoric acid to separate the individual wafers after diffusion. Another disadvantage is that the results obtained can be variable from lot to lot. Further, undesirable impurity effects are common at the edges of the wafers.

At the present time for the manufacture of silicon wafers having a single junction contained therein it is common practice to diffuse into the wafer a first conductivity type impurity. The impurity enters the wafer over its entire exterior surface. An oxide is also grown on the exterior surface. The wafer is lapped on one face to a depth sufficient to remove the oxide and the first conductivity type impurity. The wafer is then diffused a second time with an opposite conductivity type impurity over the lapped area to complete formation of the junction contained within the wafer. While this process produces wafers superior in junction characteristics to those that can be obtained by the simultaneous diffusion stacking process described above, it obviously requires more manipulative steps, each of which add to the ultimate cost of the product.

A process which has been widely employed in the manufacture of PNPN$^+$ devices is the simultaneous diffusion of gallium and arsenic into a silicon wafer. In this process one surface of the wafer, which is initially of N type conductivity, is covered with an oxide while the major portion of the remaining surface is maintained free of oxide. The arsenic is unable to penetrate the oxide layer, and is limited in penetration to those areas of the wafer that are oxide free. The gallium penetrates the oxide covered surfaces of the wafer to form layers of P conductivity type and also penetrates the oxide free areas of the wafer to a depth greater than that reached by the arsenic. Thus, over the oxide free surface portions of the wafer an N conductivity type layer is formed adjacent the surface while a P conductivity type layer is formed within the wafer beneath the surface N conductivity type layer. While this simultaneous diffusion process works well for formation of PNPN$^+$ devices, the formation of the interior P layer renders this process unsuitable for formation of single internal junction wafer, such as PIN, PNN$^+$, and P$^+$PN structures.

It is an object of my invention to provide a diffusion process capable of reliably and reproduceably simultaneously forming N and P layers.

It is a more specific object of my invention to provide a process for the formation of a junction within a silicon wafer in a single diffusion operation.

These and other objects of my invention are accomplished in one aspect by a process for forming a junction within a silicon element comprising providing an oxide layer on a selected surface of the silicon element. The element is located in proximity with a source of gallium and phosphorus vapors, and the two are heated to a temperature in excess of 1000° C to generate a vaporous mixture of gallium and phosphorus. Gallium diffuses through the oxide layer and into the selected surface to form a P conductivity type layer while phosphorus vapor is substantially blocked from penetration through the oxide layer. Simultaneously, both gallium and phosphorus are diffused into a remaining surface of the element to establish a phosphorus diffusion profile of a magnitude and depth exceeding that of gallium entering the element through the remaining surface to form an N conductivity type layer.

Figure 2:
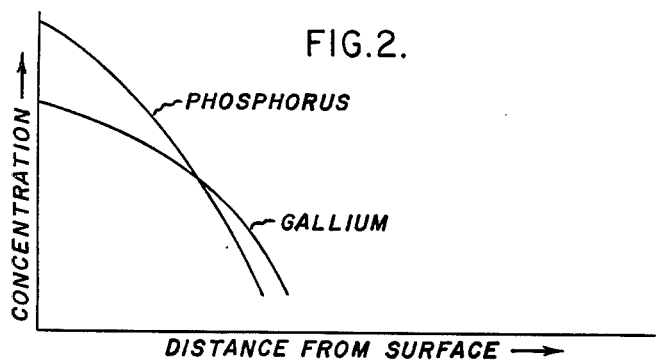
Figure 3:
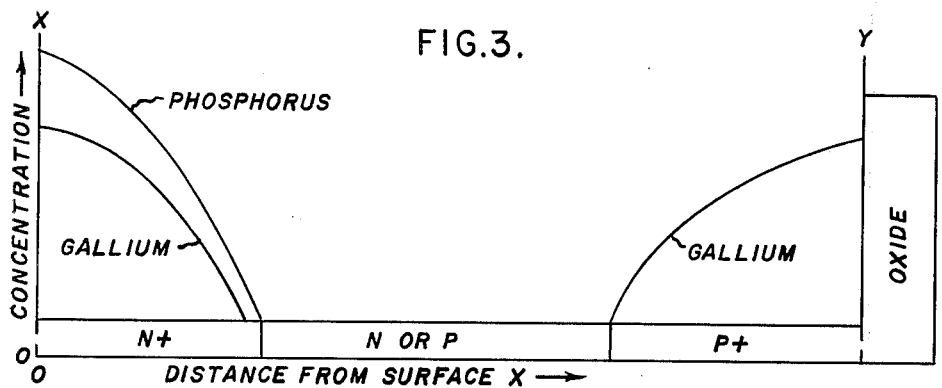

My invention may be better understood by reference to the following detailed description considered in conjunction with the drawings, in which FIG. 1 is a schematic diagram of the impurity profile of a PNPN$^+$ silicon element formed by conventional single diffusion techniques;

FIG. 2 is a schematic diagram showing the diffusion profiles obtainable employing either gallium or phosphorus alone as a diffusant; and FIG. 3 is a schematic diagram of the diffusion profile of a single junction silicon element formed according to my process.

Looking at FIG. 1 a diffused impurity profile is shown for a PNPN$^+$ silicon element formed by the simultaneous diffusion of both arsenic and gallium according to known techniques. From this diagram it can be seen that only gallium diffuses into the silicon element along the surface Y, since this surface is covered by a silicon dioxide layer. The gallium which diffuses into the element along the Y surface forms the external P conductivity type layer. Along the X surface of the element both gallium and arsenic enter. The arsenic exhibits a higher surface concentration and hence forms the external N$^+$ conductivity type layer along the X surface. The gallium, on the other hand, penetrates deeper into the element than the arsenic and forms an internal P conductivity type layer. The internal N conductivity type layer of the element results from a uniformly distributed low level N conductivity type impurity initially present in the element before it is subjected to the simultaneous diffusion of gallium and arsenic.

From the foregoing it is apparent that the known process for the simultaneous diffusion of gallium and arsenic is unsuited for the formation of a single junction within a silicon element by simultaneous diffusion of opposite conductivity type impurities from opposite major surfaces. What is true for the simultaneous diffusion of gallium and arsenic would also appear true for the simultaneous diffusion of gallium and phosphorus.

This is illustrated by reference to FIG. 2. Assuming the separate diffusion of phosphorus and gallium into each of two identical silicon elements under comparable conditions, the relationship of the phosphorus and gallium profiles would be as shown. Just as in the case of arsenic and gallium it can be seen that while the phosphorus exhibits the higher surface concentration, the gallium penetrates to a greater depth. Hence, if gallium and phosphorus were simultaneously diffused under comparable conditions into the same silicon element, it would be expected that an N conductivity type layer would result along the element surface while a P conductivity type layer would be formed therebeneath within the element.

I have discovered quite unexpectedly that when a silicon wafer is simultaneously diffused with gallium and phosphorus in a manner analogous to that employed to form $PNPN^+$ structures by simultaneous gallium and arsenic diffusion an $N^+NP$ structure results. This can best be appreciated by reference to FIG. 3, which is intended to be comparable to FIG. 1. In this case gallium enters the Y surface of the silicon element by selective penetration of the silicon dioxide layer as in the case of simultaneous gallium and arsenic diffusion. The resulting external P conductivity type layer is essentially unchanged. Along the X surface, which is substantially free of any diffusion barrier layer, both gallium and phosphorus enter the silicon element. As expected, phosphorus maintains a higher surface concentration than gallium. In an unexpected manner, however, the phosphorus concentration exceeds that of gallium throughout the depth of diffusion. An $N^+$ conductivity type layer is formed adjacent the X surface of the silicon element, but no internal P layer is formed, as occurs with the simultaneous diffusion of gallium and arsenic. I believe that the lack of an internal P layer is attributable to an interaction of the gallium and phosphorus.

The internal region of the silicon element is shown in FIG. 3 as being of either N or P conductivity type. I have observed that the silicon element may initially have a low level uniformly distributed impurity of either conductivity type. As is well understood in the art the voltage blocking capability of the junction formed according to my process is improved as an inverse function of the impurity concentration initially present in the silicon element. For most rectifier applications I prefer that the silicon element initially exhibit a bulk resistivity of greater 1 1 ohm-cm, or less than about 5.5 $\times 10^{15}$ impurity atoms/cc when of N conductivity type or $1.6 \times 10^{16}$ atoms/cc when of P conductivity type.

To prepare the silicon element for simultaneous gallim and phosphorus diffusion I selectively form an oxide diffusion gallium for phosphorus on one surface of the element which permits gallium migration therethrough. The preferred technique is to heat the element in an oxygen and/or steam atmosphere to grow a silicon dioxide external barrier layer over the entire external surface of the element. Thereafter the oxide may be selectively removed by known techniques from those areas over which it is desired to achieve phosphorus penetration. Most commonly silicon elements are in the form of wafers—that, they have two substantially parallel, opposed major surfaces with a thin edge surface, typically less than 20 mils in width, therebetween. In such instance it is usually desirable to prepare the wafer for diffusion with one major surface substantially free of oxide and the remaining major surface covered with oxide. Typically the edge surface is also covered with oxide, but this surface is of such limited extent that it may be ignored. This approach is particularly suited for the fabrication of rectifiers. It is recognized that my invention also may be readily applied to the fabrication of semiconductor elements generally including, but not limited to, transistors, thyristors, and integrated circuits. For these latter applications it is recognized that it may be desirable to have the phosphorus diffusion barrier layer cover less than the entire surface of the silicon element and to be configured to a specific geometrical form. The provision of oxide layers in this manner is, of course, within the skill of the art and requires no detailed explanation. Further, it may be desirable in these applications to limit diffusion to only one major surface of the element, as by use of a silicon nitride layer over one major surface.

The simultaneous diffusion of phosphorus and gallium is accomplished by heating the silicon element together with a source of phosphorus and gallium vapors to a temperature above about 1000° C in an inert atmosphere. A noble gas such as argon is typically employed to provide the inert atmosphere. Any conventional source materials for phosphorus and gallium vapors may be employed. A particularly suitable source material is gallium phosphide. The source material is preferably provided in sufficient amount so that it is non-limiting so far as phosphorus and gallium vapors are concerned. That is, sufficient source material is provided to saturate the atmosphere with vapor phase phosphorus and gallium throughout the period of diffusion. The provision of excess source material is preferred, since this provides a convenient method for assuring uniform diffusion results in processing successive batches of elements. It is particularly important that the phosphorus vapor saturate the atmosphere throughout most, if not all, of the diffusion period, since this avoids any tendency of the gallium to form an internal P conductivity type region. The depth of the P and N conductivity type layers formed by diffusion is, of course, a function of the duration of heating.

To illustrate my invention by way of example, I took as a starting material 100 1½ inch diameter silicon wafer of uniform phosphorus concentration having a resistivity of from 25 to 35 ohm-cm. These wafers were saw cut to a thickness of 9 mils (0.009 inch). The wafers were exposed to a mixture of oxygen and steam for 3½ hours at 1200° C to form a silicon dioxide coating over all external surfaces. After removal from the oxidizing atmosphere, one major surface of each wafer was coated with Apiezon black wax, and the wafers were immersed in a saturated solution of hydrofluoric acid. When the exposed oxide layers not covered by the wax were visually observed to be removed by the acid, the wafers were removed from the acid and placed in trichloroethylene to strip away the wax. The wafers were thereafter cleaned preparatory to diffusion.

For diffusion the wafers were stacked in a quartz tube having a 33mm I. D. and a 10 inch length when sealed. The wafers were stacked in the tube on edge with a source wafer smeared with gallium located at each end of the stack and two source wafers located within the stack to divide the stack into three equal segments. The source wafers were spaced from the remaining wafers by annular quartz spacers and scrap undiffused wafers were interposed to shield the wafers to be diffused from direct opposition to the source wafers. Four hundred and twenty milligrams of gallium phosphide were located at one end of the tube. The tube was filled with 0.20 atm of argon and sealed. The tube with the wafers and source materials enclosed was placed in a diffusion furnace and maintained at 1250° C for 40 hours. The temperature of the furnace was then reduced to 625° C over a 10 hour period. Thereafter the wafers were removed from the furnace and from the tube.

Sectioning and staining of one of the wafers taken from the tube indicated the wafer to have a P conductivity type layer adjacent one major surface extending to a depth of 2.72 mils and an $N^+$ conductivity type layer adjacent the oposite major surface extending to a depth of 2.66 mils. The remaining central region of the wafer, 3.62 mils in width, remained of low level N conductivity type. There was no evidence of any internal P conductivity type layer. A measurement of surface concentrations showed the major surface adjacent the P conductivity type region to have a surface concentration of $7.5 \times 10^{18}$ impurity atoms/cc while the surface adjacent the $N^+$ conductivity type region exhibited a surface impurity concentration of $2.1 \times 10^{21}$ impurity atoms per cc.

The above exemplary procedure was repeated utilizing 50 wafers of 1 inch diameter initially of uniform P conductivity type having an initial resistivity of from 40 to 60 ohm-cm. A diffusion time of 35 hours was utilized instead of 40 hours. Sectioning and staining of a representative wafer indicated the N region to extend to a depth of 2.86 mils and the $P^+$ region to extend to a depth of 2.90 mils. The central P conductivity type region was 3.24 mils in width. A measurement of surface concentrations showed the major surface adjacent the $P^+$ conductivity type region to have a surface concentration of $1.2 \times 10^{19}$ impurity atoms/cc while the surface adjacent the $N^+$ conductivity type region exhibited a surface concentration of $1.4 \times 10^{21}$ impurity atoms per cc.

While I have described my invention with reference to certain preferred embodiments, it is appreciated that numerous variations will readily occur to those skilled in the art. It is accordingly intended that the scope of my invention be determined by reference to the following claims.

What I claim and desire to secure by Letters Patent of the United States is:

1. A process for forming a junction within a silicon wafer having opposed, substantially parallel major surfaces comprising:

providing an oxide layer on one major surface, locating the wafer in a closed tube containing only an inert non-oxidizing atmosphere and a non-limiting source of gallium and phosphorus vapors, heating the wafer and vapor source within the closed tube to a temperature in excess of 1000° C for about 35 to 40 hours to generate a vaporous mixture of gallium and phosphorus without oxidizing the surface of the wafer not previously provided with said oxide layer, diffusing gallium through the oxide layer and into the one major surface to form a P conductivity type layer while substantially blocking phosphorus vapor penetration through the oxide layer, and simultaneously, diffusing both gallium and phosphorus into the remaining major surface of the wafer while maintaining the atmosphere in the closed tube saturated with phosphorus vapor to establish a phosphorus diffusion profile of the form shown in FIG. 3 with a magnitude and depth exceeding that of gallium entering the wafer through the remaining major surface to form an $N$ conductivity type layer.

2. A process for simultaneously forming, in a silicon wafer having opposed substantially parallel major surfaces, a $P^+$ conductivity type layer adjacent one major surface and an $N^+$ conductivity type layer adjacent the opposite major surface comprising:

providing an oxide layer on said one major surface, locating the wafer in a closed tube containing only an inert non-oxidizing atmosphere and a non-limiting source of gallium and phosphorus vapors, heating the wafer and vapor source within the closed tube to a temperature in excess of 1000° C for about 35 to 40 hours to generate a vaporous mixture of gallium and phosphorus without oxidizing the surface of the wafer not previously provided with said oxide layer, diffusing gallium through the oxide layer and into the one major surface to form the $P^+$ conductivity type layer while substantially blocking phosphorus vapor penetration through the oxide layer, and simultaneously, diffusing both gallium and phosphorus into the remaining major surface of the wafer while maintaining the atmosphere in the closed tube saturated with phosphorus vapor to establish a phosphorus diffusion profile of the form shown in FIG. 3 with a magnitude and depth exceeding that of gallium entering the wafer through the remaining major surface to form the $N^+$ conductivity type layer.

3. A process according to claim 2 in which said wafer and vapor source is maintained at approximately 1250° C.

4. A process according to claim 2 wherein said inert non-oxidizing atmosphere is 0.2 atmospheres of Argon.

5. A process for forming a junction within a silicon wafer having opposed, substantially parallel major surfaces comprising:

oxidizing the entire exterior surface of the silicon wafer, selectively removing oxide from a portion of the surface, locating the wafer in a closed tube containing an inert atmosphere with a non-limiting source of gallium and phosphorus vapors, heating the wafer and vapor source within the closed tube to a temperature in excess of 1000° C for about 35 to 40 hours to generate a vaporous mixture of gallium and phosphorus, diffusing gallium through the oxidized portion of the exterior surface of the silicon wafer to form a P conductivity type layer while substantially blocking phosphorus vapor penetration through the oxidized surface portion, and simultaneously, diffusing both gallium and phosphorus into the wafer over the surface portion haivng oxide selectively removed therefrom to establish a phosphorus diffusion profile of the form shown in FIG. 3 with a magnitude and depth exceeding that of gallium entering the wafer through the same surface portion to form an N conductivity type layer.

6. A process according to claim 5 in which said wafer and vapor source is maintained at approximately 1250° C.

7. A process according to claim 5 wherein said inert non-oxidizing atmosphere is 0.2 atmospheres of Argon.

8. A process according to claim 5 in which a low level P conductivity type impurity is initially uniformly distributed through the silicon wafer.

9. A process according to claim 5 in which a low level N conductivity type impurity is initially uniformly distributed through the silicon wafer.

10. A process according to claim 5 wherein the gallium diffusing through the oxidized portion diffuses more deeply, than does the phosphorus diffusing through the surface portion having the oxide removed therefrom.

* * * * *